(12) United States Patent
Chen et al.

(10) Patent No.: US 8,421,725 B2
(45) Date of Patent: Apr. 16, 2013

(54) DISPLAY DEVICE AND MANUFACTURE METHOD THEREOF

(75) Inventors: Tai-Cheng Chen, Hsin-Chu (TW); Seng-Chieh Chen, Hsin-Chu (TW); Chih-Kang Wu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 448 days.

(21) Appl. No.: 12/623,609

(22) Filed: Nov. 23, 2009

(65) Prior Publication Data

US 2010/0141567 A1  Jun. 10, 2010

(30) Foreign Application Priority Data

Dec. 5, 2008 (TW) .............................. 97147570 A

(51) Int. Cl.
*H02B 1/00* (2006.01)
(52) U.S. Cl.
USPC .................. 345/87; 349/58; 349/60; 361/600
(58) Field of Classification Search .................. None
See application file for complete search history.

(56) References Cited

U.S. PATENT DOCUMENTS

| 7,456,807 B2* | 11/2008 | Mizuno et al. ................... 345/60 |
| 7,466,540 B2* | 12/2008 | Takahashi et al. ....... 361/679.27 |
| 2006/0197721 A1* | 9/2006 | Mizuno et al. ................... 345/60 |
| 2007/0115625 A1* | 5/2007 | Jang et al. ...................... 361/683 |
| 2007/0216702 A1* | 9/2007 | Takahashi et al. ............ 345/582 |
| 2009/0154076 A1* | 6/2009 | Beak et al. ............... 361/679.01 |
| 2009/0225240 A1* | 9/2009 | Suzuki et al. ................. 348/843 |

FOREIGN PATENT DOCUMENTS

| TW | M274735 | 3/1994 |
| TW | I274939 | 7/1994 |
| TW | 200706946 A | 2/2007 |
| TW | 200735658 A | 9/2007 |
| WO | WO 2007117060 A2 * | 10/2007 |

OTHER PUBLICATIONS

English language translation of abstract of TW I274939.
English language translation of abstract of TW M274735.
English translation of abstract and pertinent parts of TW 200735658A.
English translation of abstract and pertinent parts of TW 200706946 A.
Taiwan Office Action dated May 28, 2012.

* cited by examiner

*Primary Examiner* — Joseph Haley
(74) *Attorney, Agent, or Firm* — McClure, Qualey & Rodack, LLP

(57) ABSTRACT

The present invention discloses a flat display device and a manufacture method thereof. The flat display device includes a flat display module, a front cover, an auxiliary support, a back cover set, and a circuit board. The back cover set includes a sub-cover and a main back cover, wherein the circuit board is disposed on the inner surface of the sub-cover. The front cover has a display opening for an active area of the flat display module to be exposed outside the display opening and present images through the display opening. The main back cover includes a opening for part of the sub-cover to pass through and be exposed outside the opening.

15 Claims, 10 Drawing Sheets

DISPLAY DEVICE AND MANUFACTURE METHOD THEREOF

BACKGROUND OF THE INVENTION

1. Field of the Invention

This invention relates to a flat display device and a manufacture method thereof and specifically, to a liquid crystal display and a manufacture method thereof.

2. Description of the Prior Art

Ever since the liquid crystal displays (LCDs) have become the mainstream display devices, to reduce the thickness and weight is always the main focus of manufacturers. The weight can be reduced by reducing the number of elements used or reducing the weight of individual element. One way to reduce the weight of individual element while maintaining the functionality of the element is to reduce the use of nonfunctional materials.

As for LCDs, the frame for accommodating the display panel to be disposed thereon contains most nonfunctional materials. Thus to reduce LCD's weight normally aims at reducing materials of the frame. However, reducing materials of the frame will also influence the number and position of apertures originally formed on the frame. Correspondingly, the number of elements used to connect components of the LCD is reduced which results in weak connections between components. Thus it can be seen that one of the difficulties in reducing of LCD's weight is to reduce the number of elements used or to minimize the weight of individual element while maintaining the functionality of the elements of the LCD.

SUMMARY OF THE INVENTION

It is an object of the present invention to provide a flat display device and a manufacture method thereof, wherein the overall weight of the display device is reduced.

It is another object of the present invention to provide a flat display device and a manufacture method thereof for simplifying the wiring management and connection within the flat display device to further improve the assembly efficiency of the flat display device.

It is yet another object of the present invention to provide a flat display device and a manufacture method thereof for reducing the material used and overall cost of the flat display device.

The flat display device includes a flat display module, a front cover, an auxiliary support, a back cover set and a circuit board. The back cover set includes a sub-cover and a main back cover. The circuit board is disposed on the inner surface of the sub-cover and located between the auxiliary support and the sub-cover. The main back cover includes an opening for allowing at least part of the sub-cover to protrude therethrough, to fill therein, and/or to be exposed through the opening.

In one embodiment of the present invention, the main back cover includes a plurality of openings for accommodating a plurality of sub-covers to be combined with the main back cover.

In another embodiment of the present invention, the flat display device further includes a stand coupler and a supporting stand. The stand coupler is connected to the auxiliary support and near one end of the flat display module, but is not limited thereto; in different embodiments, the stand coupler can be coupled to a different part of the auxiliary support or connected to the back side of the flat display module. One end of the supporting stand is connected to the stand coupler while the other end of the supporting stand extends away from the stand coupler to be disposed on a plane (such as desktop).

DETAILED DESCRIPTION OF THE PREFERRED EMBODIMENT

The present invention provides a flat display device and a manufacture method thereof. The flat display device disclosed below is a liquid crystal flat display device, but is not limited thereto. In different embodiments, the flat display device may include an organic light emitting diode (OLED) display device. Furthermore, the flat display device of the present invention includes a back cover set, wherein the back cover set includes a sub-cover and a main back cover which are separable pieces.

Figure 1:
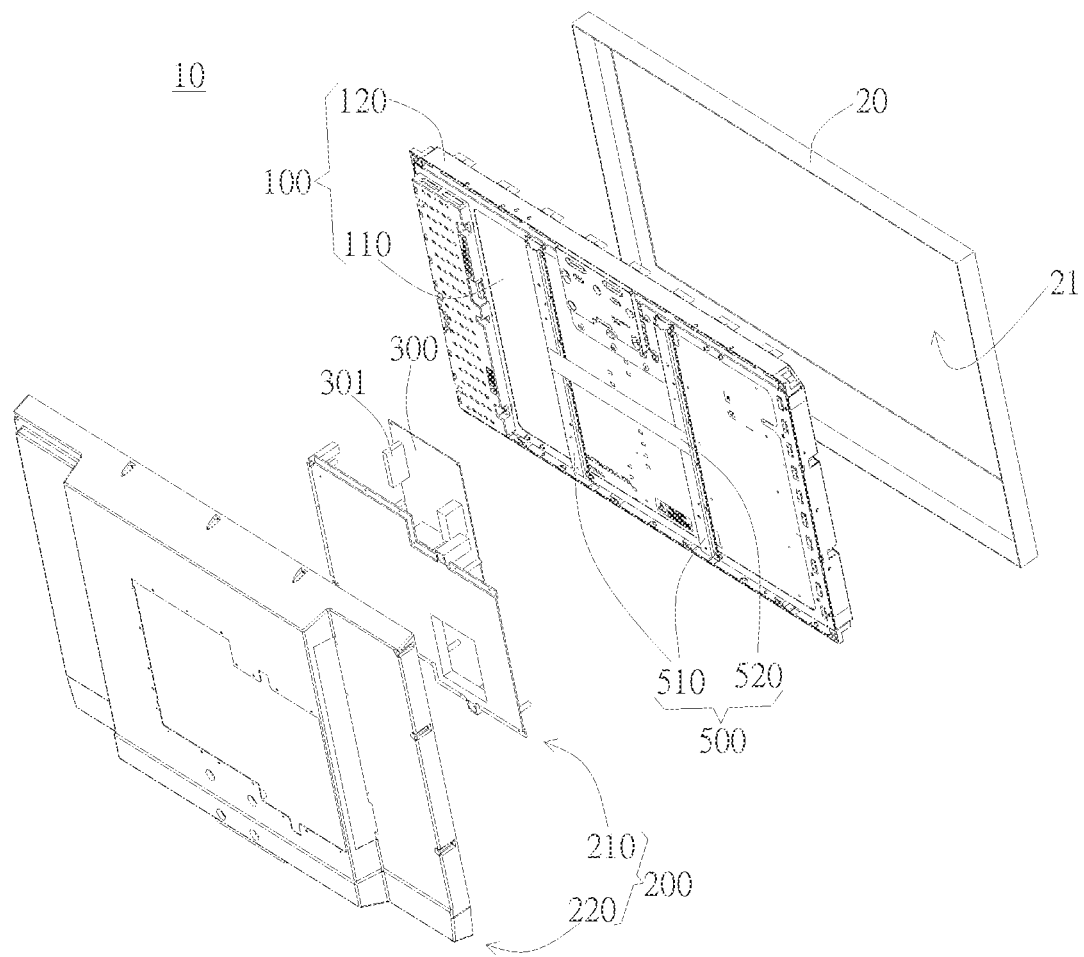
FIG. 1 is an exploded view of the flat display device of the present invention.

FIG. 1 is an exploded view illustrating the first embodiment of the flat display device of the present invention. As FIG. 1 shows, the flat display device 10 includes a flat display module 100, a front cover 20, an auxiliary support 500, a back cover set 200, and a first circuit board 300. The back cover set 200 includes a first sub-cover 210 and a main back cover 220, wherein the first circuit board 300 is disposed on the inner surface of the first sub-cover 210. The flat display module 100 of the present embodiment includes a display panel 110 and a frame 120, wherein the display panel 110 includes an active area (not illustrated) on which the display panel 110 present images based on electronic image signals. The frame 120 is disposed around the display panel 110 and substantially encloses the display panel 110. The front cover 20 has a display opening 21 corresponding to the active area of the flat display module 100, wherein the active area is exposed through the display opening 21 for displaying images.

As FIG. 1 shows, the auxiliary support 500 is disposed between the flat display module 100 and the back cover set 200. The auxiliary support 500 is connected to the flat display module 100 to reinforce the structure strength of the flat display device 10 and withstand external stress applied on the flat display device 10. In the present embodiment, the flat display module 100 includes a display panel 110 and a frame 120, wherein the frame 120 is disposed around the display panel 110. The auxiliary support 500 of the present embodiment includes two first ribs 510 and a second rib 520 for withstanding external stresses applied on the flat display device 10 to increase the structure strength of the flat display device 10. The first ribs 510 are disposed in parallel on the display panel 110. Furthermore, two ends of the first rib 510 are connected to two opposite sides of the flat display panel 110 respectively, but are not limited thereto. In different embodiments, two ends of the first rib 510 or two ends of the second rib 520 can be connected to the frame 120. The first ribs 510 and the second rib 520 are parallel to two different pairs of parallel sides of the flat display module 100, respectively. The second rib 520 is perpendicular to the first ribs 510 and two ends of the second rib 520 are connected to two first ribs 510, respectively.

In the embodiment illustrated in FIG. 1, the second rib 520 is perpendicular to two first ribs 510 while its two ends are connected to the central portions of the first ribs 510, but is not limited thereto. In different embodiments, based on the material or the space limitations, the auxiliary support may have different number of first ribs 510 or second ribs 520. Furthermore, the second rib 520 can be connected to different portion of the first rib 510 according to space limitation.

As FIG. 1 shows, the first sub-cover 210 is disposed between the main back cover 220 and the auxiliary support 500 and also connected to the auxiliary support 500. The first circuit board 300 is disposed on the inner surface of the first sub-cover 210 and is between the auxiliary support 500 and the first sub-cover 210. The first circuit board 300 of the present embodiment can be a printed circuit board having a plurality of electronic components disposed thereon. The main back cover 220 includes a first opening for allowing part of the first sub-cover 210 to protrude therethrough, wherein the first sub-cover 210 fills the first opening and is exposed outside the first opening. That is, after the first sub-cover 210 and the main back cover 220 are combined, the part of the first sub-cover 210 protruding through the first opening is preferably coplanar with the main back cover 220. After the first sub-cover 210 is connected to the auxiliary support 500, the main back cover 220 is connected to the front cover 20 and the first sub-cover 210 to cover the flat display module 100, the auxiliary support 500, and the first circuit board 300 therein.

Figure 2A:
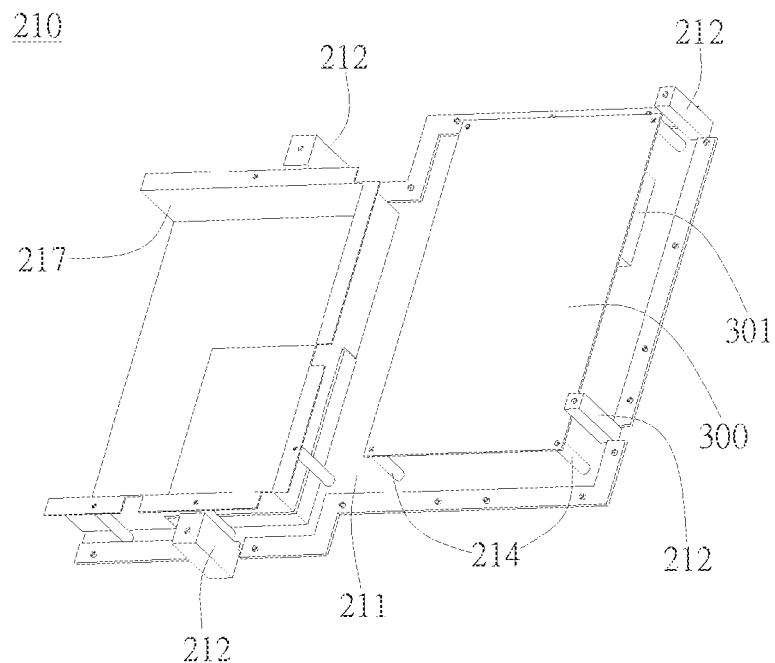
FIG. 2A is a schematic view illustrating a first sub-cover connected to a circuit board.

FIG. 2A is a schematic view illustrating the first sub-cover 210 combined with circuit board 300, wherein the first sub-cover 210 includes a back cover portion 211 and four connecting portions 212. In the present embodiment, one side of the back cover portion 211 is used to accommodate the first circuit board 300. The connecting portion 212 is disposed on the edge of the back cover portion 211 and is partially bent to extend perpendicularly from the back cover portion 211, wherein a space is formed between assembled connecting portions 212 and the back cover portion 211. The connecting portion 212 has an opening for allowing a screw or other connecting element to pass through and couple to the back side of the flat display module. Furthermore, the first circuit board 300 of the present embodiment is disposed on four circuit board supports 214 while the first circuit board 300 has a first electronic module 301 located within the space between the first circuit board 300 and the back cover portion 211. The first electronic module 301 includes electronic components for processing power source or used in a main board. In different embodiments, the first circuit board 300 can be disposed directly on the back cover portion 211 and the first electronic module 301 is exposed opposite to the back cover portion 211.

Figure 2B:
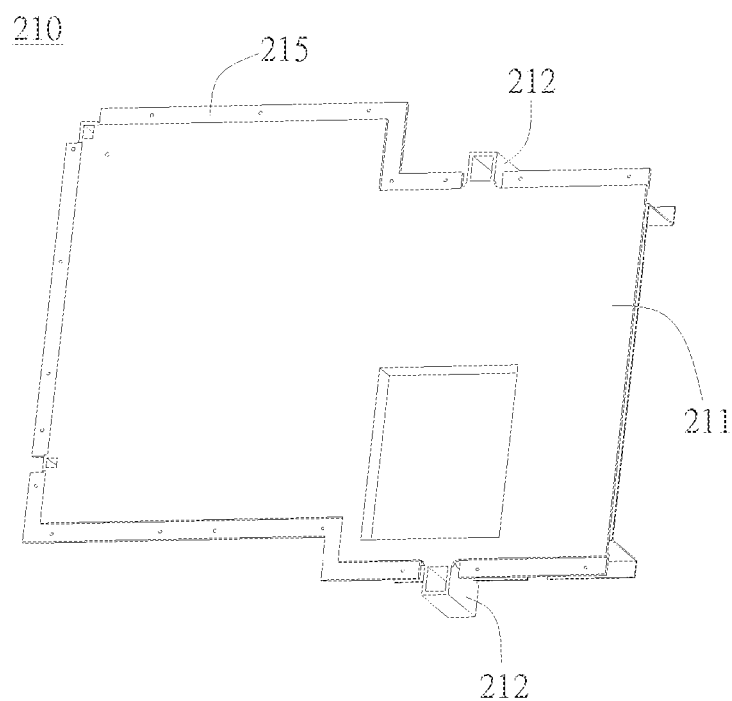
FIG. 2B is a front view of the first sub-cover.
Figure 3:
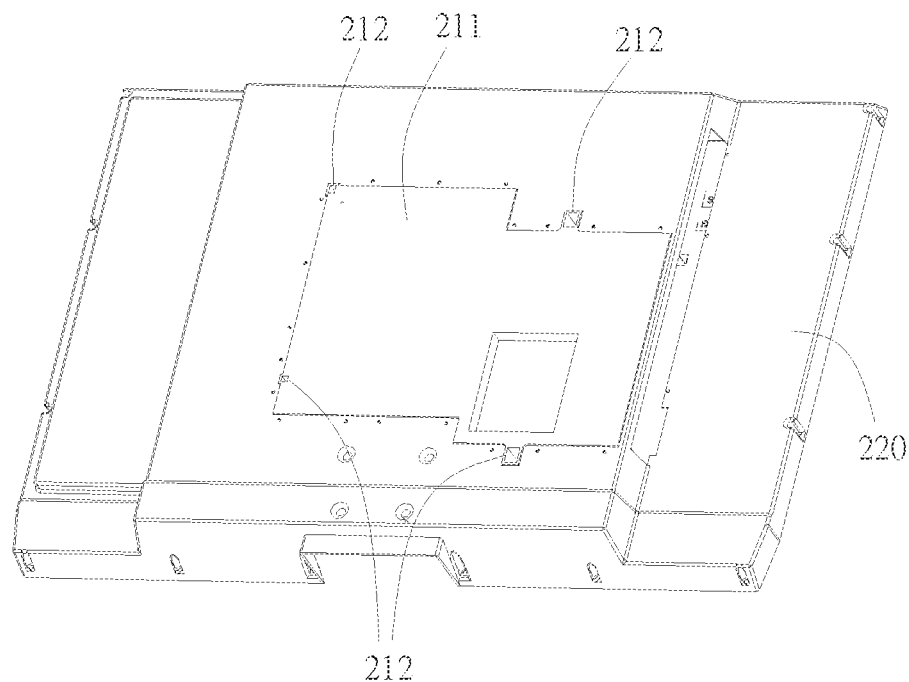
FIG. 3 is a schematic view illustrating the first sub-cover combined with the main back cover.

FIG. 2B is a front view of the first sub-cover illustrated in FIG. 1. As FIG. 2B shows, the first sub-cover 210 of the back cover set 200 includes a main back cover connector 215 for coupling the inner surface of the main back cover (not illustrated) to allow the side of the back cover portion 211 not disposed with first circuit board 300 to be exposed outside the first opening of the main back cover. The main back cover connector 215 is partially disposed along the edge of the back cover portion 211 and provided with openings to be coupled to the inner surface of the main back cover by means of screws. FIG. 3 is a schematic view illustrating the first sub-cover 210 combined with the main back cover 220. As FIG. 3 shows, the dimension of the back cover portion 211 of the first sub-cover 210 corresponds to that of the first opening (not illustrated) of the main back cover 220. The main back cover connector (not illustrated) is connected to the inner surface of the main back cover 220 and is used to hinder the first sub-cover 210 from escaping through the first opening. In the embodiment illustrated in FIG. 3, the back cover set 200 includes only one sub-cover and a corresponding opening on the main back cover 220, but is not limited thereto. In different embodiments, the back cover set can have different number of sub-cover and corresponding number of openings on the main back cover 220 based on space or circuitry requirements etc. As FIG. 3 shows, the first sub-cover 210 and the main back cover 220 of the back cover set 200 are separate elements. Thus the circuit board can be disposed on the inner surface of the first sub-cover before the first sub-cover is combined with the main back cover. Furthermore, the circuitry on the circuit board can be connected to the flat display module before the main back cover and the front cover are assembled. The above-mentioned assembly methods simplify the wiring arrangement and connection of the flat display device and improve the assembly efficiency (or throughput) of the flat display device.

Figure 4:
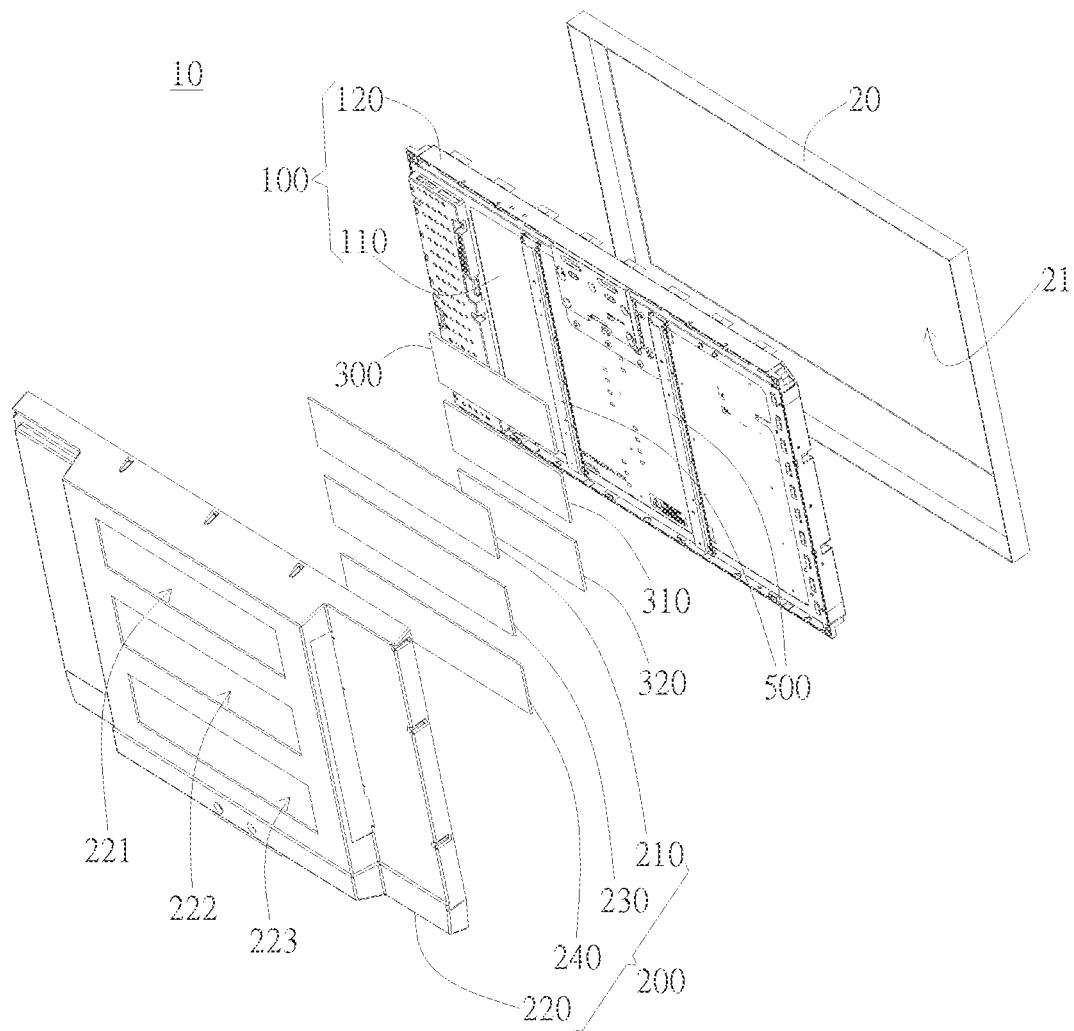
FIG. 4 is a schematic view illustrating a modification of the flat display device illustrated in FIG. 1.

FIG. 4 is a schematic view of a modification of the flat display device illustrated in FIG. 1. The flat display device 10 includes a flat display module 100, a front cover 20, an auxiliary support 500, a back cover set 200, a plurality of circuit boards including a first circuit board 300, a second circuit board 310, and a third circuit board 320. The back cover set 200 includes a plurality of sub-covers and a main back cover 220. The sub-covers includes a first sub-cover 210, a second sub-cover 230, and a third sub-cover 240, wherein the first circuit board 300, the second circuit board 310 and the third circuit board 320 are disposed on the inner surface of the sub-covers 210, 230, and 240, respectively. As FIG. 4 shows, the main back cover 220 includes a plurality of openings including a first opening 221, a second opening 222, and a third opening 223. The openings 221, 222, and 223 respectively accommodate the sub-covers, 210, 230, and 240 and allow the sub-covers 210, 230, and 240 to be connected to the main back cover 220. Furthermore, the circuit boards 300, 310, and 320 are disposed on the auxiliary support 500. In other words, the circuit boards 300, 310, and 320 can be first coupled to the sub-covers 210, 230, and 240 and afterward to the auxiliary support 500.

Figure 5:
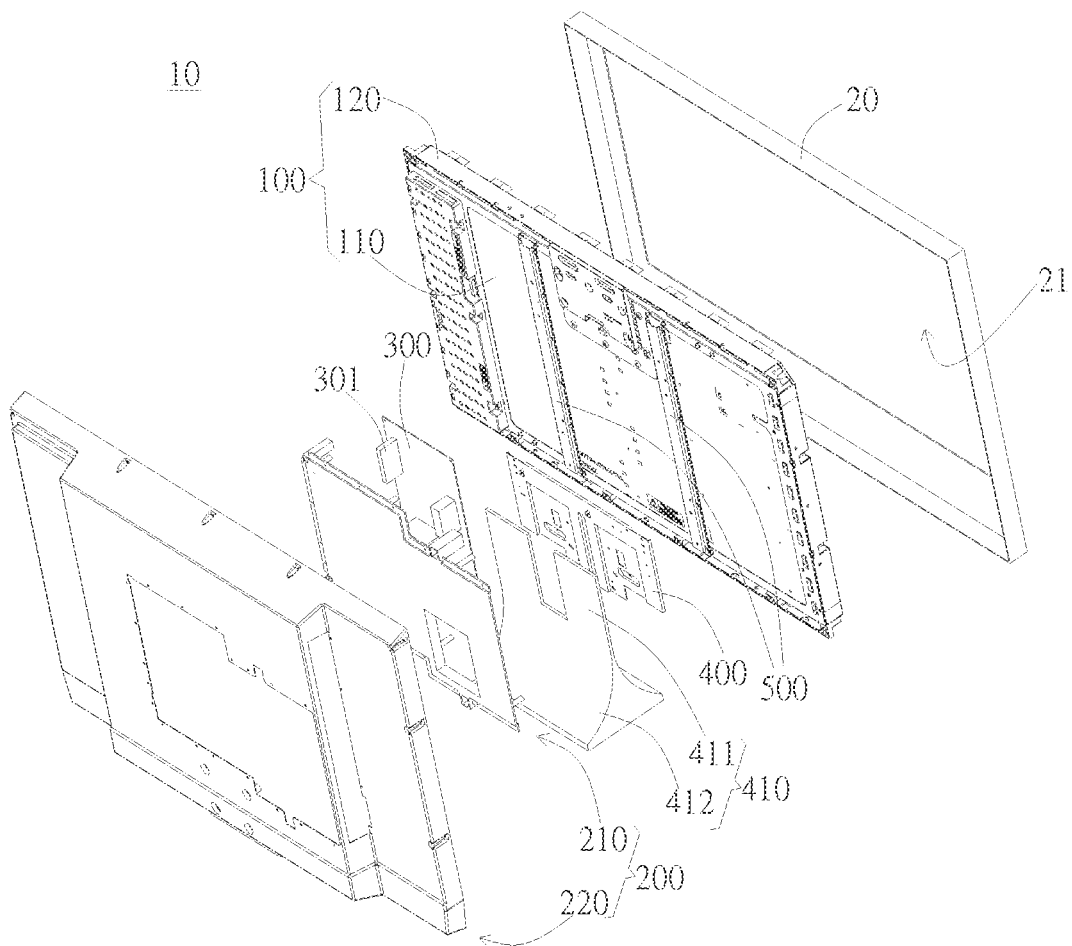
FIG. 5 illustrates another modification of the flat display device in FIG. 1.

FIG. 5 illustrates a modification of the flat display device 10 in FIG. 1, wherein the flat display device further includes a stand coupler 400 and a supporting stand 410. As FIG. 5 shows, the stand coupler 400 can be coupled to the auxiliary support 500 and then disposed near the flat display module 100. The supporting stand 410 allows the flat display device 10 to be placed on a plane (such as surface of a table). In different embodiments, the stand coupler 400 can be connected to different parts of the auxiliary support 500 or of the flat display module 100. A connecting portion 411 of the supporting stand 410 is coupled to the stand coupler 400 while a disposition end 412 extends away from the stand coupler 400 to be disposed on a plane. The stand coupler 400 and the supporting stand 410 are preferably made of metal, but are not limited thereto. In different embodiments, the stand coupler 400 and the supporting stand 410 can be made of plastic material such as vinyl plastic. Furthermore, as FIG. 5 shows, the part of the disposition end 412 of the supporting stand 410 in contact with the plane is preferably rectangular, but is not limited thereto. In different embodiments, the part of the disposition end 412 in contact with the plane can have the shape of a circle, an ellipse, or other suitable shape.

Figure 6:
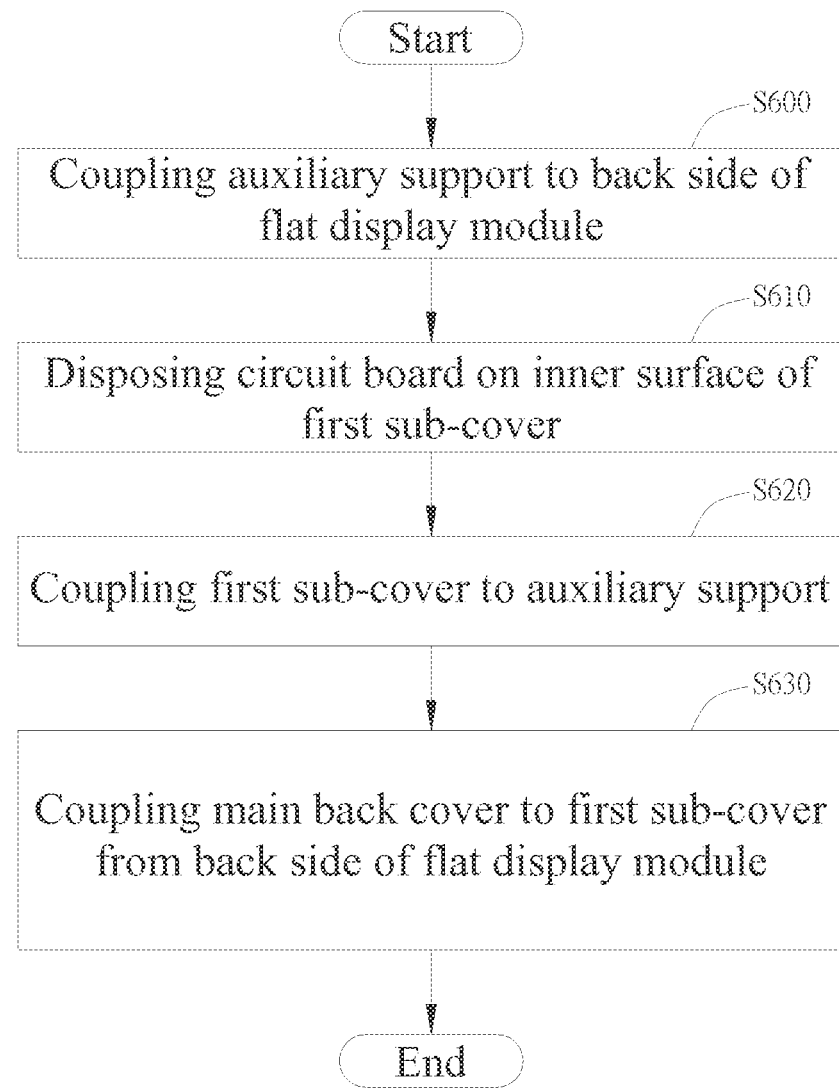
FIG. 6 is a flow chart illustrating the first embodiment of a manufacture method of the flat display device.

FIG. 6 is a flow chart illustrating the manufacture method for flat display device of the present invention. The manufacture method includes step S600 of coupling an auxiliary support to a back side of a flat display module. The above-mentioned back side of the flat display module is opposite to an active area (not illustrated) of the flat display module. In the present embodiment, the auxiliary support is coupled to the backlight module of the flat display module. The manufacture method of the present invention includes step S610 of disposing a circuit board on an inner surface of a sub-cover and step S620 of coupling the sub-cover to the auxiliary support. In the present embodiment, the sub-cover includes a back cover portion and a plurality of connecting portions, wherein the connecting portion is disposed on the edge of the back cover portion and connected to the auxiliary support. The first circuit board is disposed on the inner surface of the back cover portion and located between the auxiliary support and the first sub-cover. Step S630 includes coupling a main back cover to the first sub-cover from the back side of the flat display module. In the present embodiment, the main back cover includes a first opening and the first sub-cover is disposed corresponding to the first opening and exposed through the first opening. Furthermore, the flat display device of the present invention includes a display panel for presenting images on the active area according to electronic signals. Step S630 also includes electrically coupling electronic elements to the display panel before coupling the main back cover to the first sub-cover.

Figure 7:
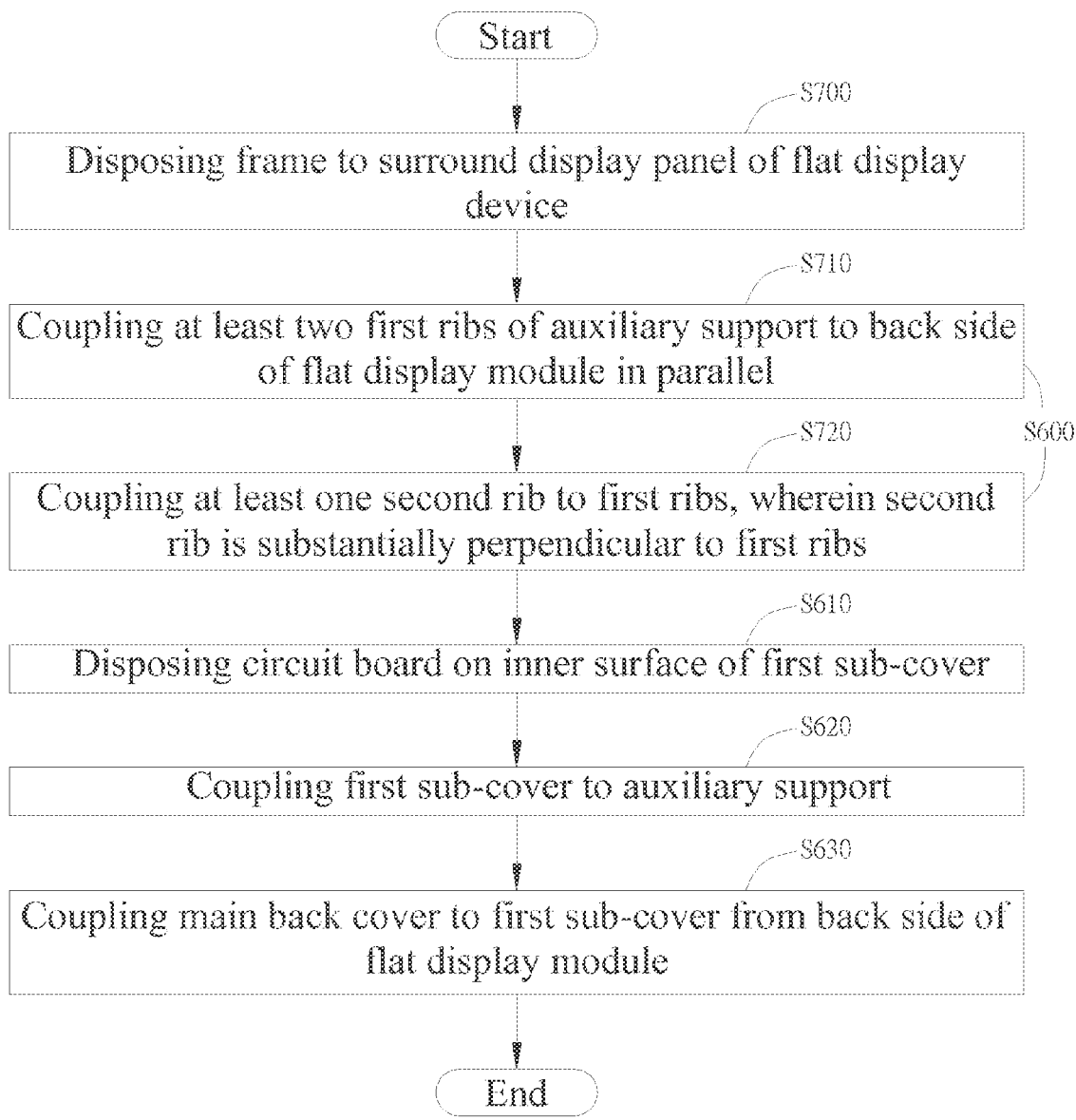
FIG. 7 illustrates a modification of the manufacture method illustrated in FIG. 6.

FIG. 7 illustrates a modification of the manufacture method in FIG. 6, wherein the manufacture method includes step S700 of disposing a frame surrounding a display panel of the flat display device. In the present embodiment, the display panel is a rectangular liquid crystal display panel, but is not limited thereto. In different embodiments, the display panel includes an organic light emitting diode (OLED) display panel. The frame is disposed on the lateral side of the display panel and substantially surrounds the display panel. In other words, the frame is disposed on four sides of the display panel and adjacent to the active area.

As FIG. 7 shows, step 600 of FIG. 6 includes S710 of coupling at least two first ribs of the auxiliary support to the back side of the flat display module in parallel and step S720 of coupling at least one second rib to the first ribs, wherein the second rib is substantially perpendicular to the first ribs. The display panel of the present embodiment is a liquid crystal display panel having a backlight module, wherein the backlight module is disposed on the side of the display panel opposite to the active area. In other words, the auxiliary support (first ribs and second rib) in the present embodiment is disposed on the backlight module of the display panel. Furthermore, the first or second rib of the present embodiment is a long strip across the back side of the display panel and connected to the frame, but is not limited thereto. In different embodiments, the auxiliary support can have other suitable shape for being connected to two adjacent sides of the frame.

Figure 8:
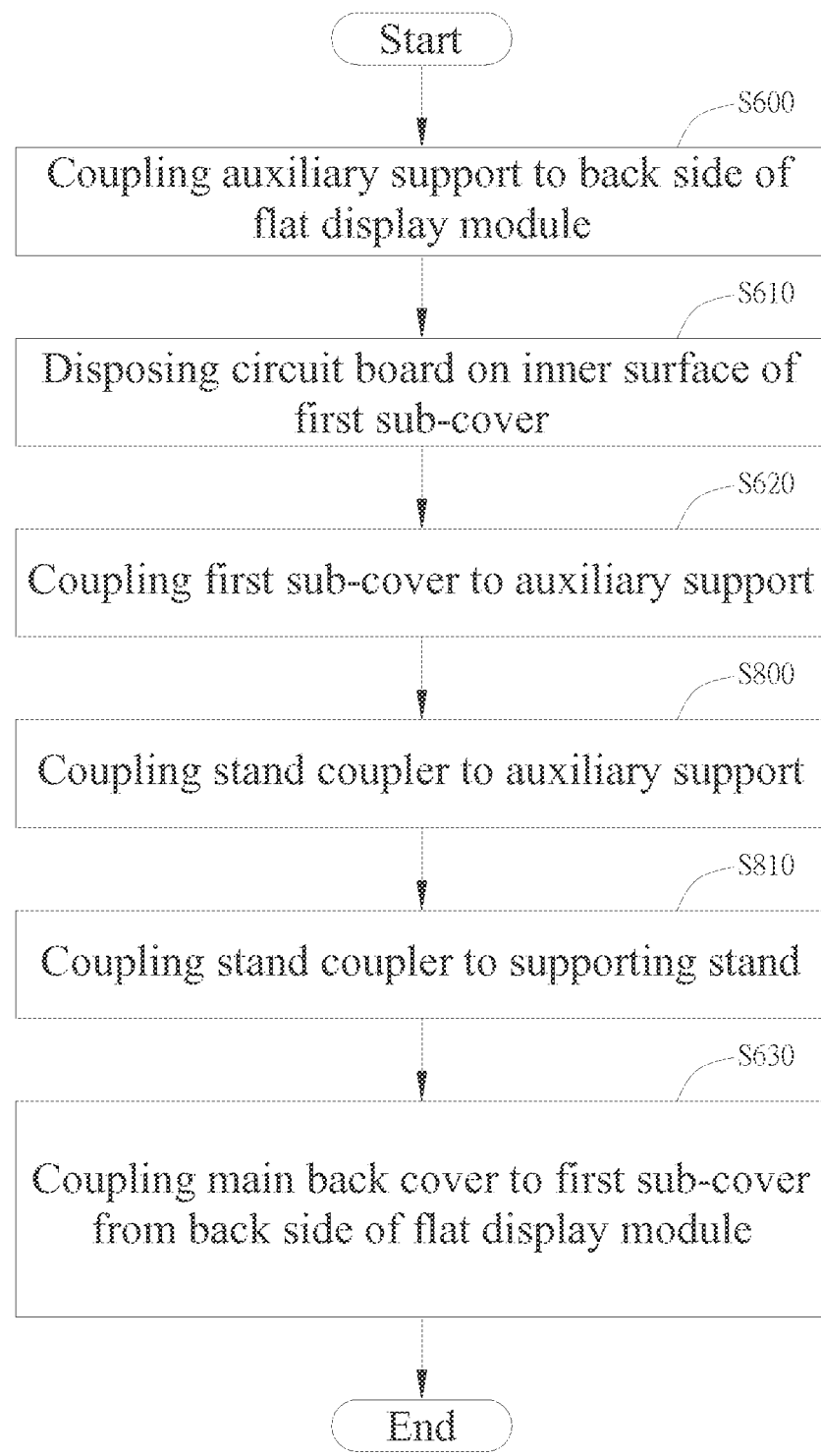
FIG. 8 illustrates another modification of the manufacture method illustrated in FIG. 6.

FIG. 8 illustrates another modification of the manufacture method illustrated in FIG. 6, wherein the manufacture method of the present embodiment includes step S800 of coupling a stand coupler to the auxiliary support. The stand coupler is then connected to a supporting stand which allows the display panel to be placed on a plane (such as desktop). The stand coupler is preferably disposed on the display panel close to one end of the display panel and coupling with one end of the auxiliary support, but is not limited thereto; in different embodiments, the stand coupler can be disposed on the central back side of the display panel.

The manufacture method of the present embodiment further includes step S810 of coupling the stand coupler to the supporting stand. In the present embodiment, one end of the supporting stand is coupled to the stand coupler, but is not limited thereto. In different embodiments, the stand coupler can be connected to different sections of the supporting stand. Furthermore, part of the supporting stand extends outside an overlapping area between the main back cover and the flat display module to be placed on a plane (such as desktop).

Figure 9:
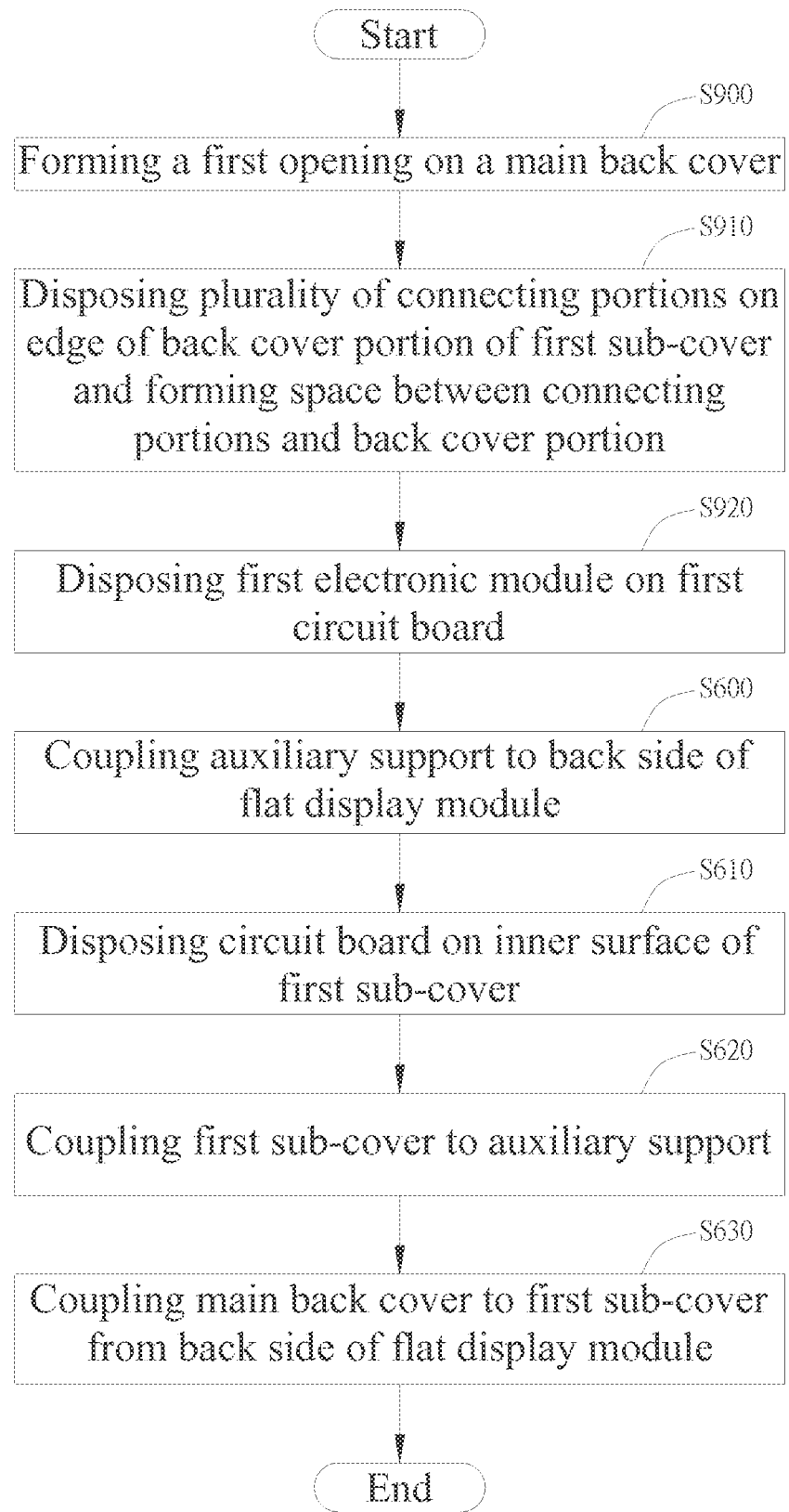
FIG. 9 illustrates yet another modification of the manufacture method illustrated in FIG. 6.

FIG. 9 illustrates yet another modification of the manufacture method illustrated in FIG. 6, wherein the manufacture method of the present embodiment includes step S900 of forming a first opening on a main back cover. The size of the first opening corresponds to that of the first sub-cover for allowing a back cover portion of the first sub-cover to pass through and be exposed outside the first opening. The manufacture method of the present embodiment further includes step S910 of disposing a plurality of connecting portions on an edge of the back cover portion of the first sub-cover and forming a space between the connecting portions and the back cover portion. The above-mentioned space is used to accommodate the first circuit board to allow the first circuit board to be disposed on the inner surface of the first sub-cover. The connecting portion is formed on the edge of the back cover portion and extends perpendicularly therefrom to be connected to the surface of the flat display module. Step S920 includes disposing a first electronic module on the first circuit board, wherein the first circuit board is disposed on the inner surface of the first sub-cover.

Figure 10:
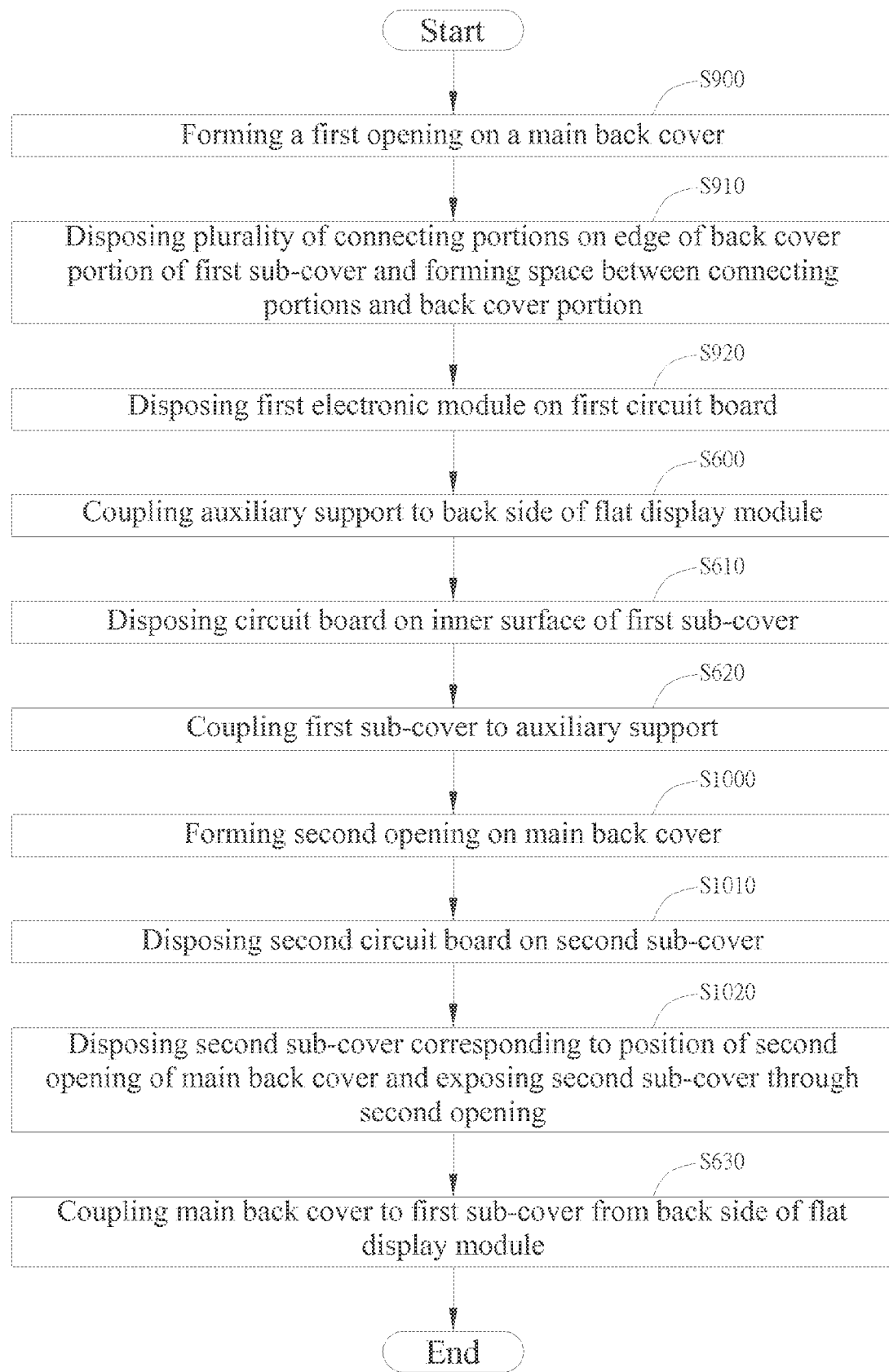
FIG. 10 is a flow chart illustrating a modification of the manufacture method illustrated in FIG. 9.

FIG. 10 is a flow chart illustrating a modification of the manufacture method illustrated in FIG. 9. The manufacture method of the present embodiment includes step S1000 of forming a second opening on a main back cover, step S1010 of disposing a second circuit board on the second sub-cover, and step S1020 of disposing the second sub-cover corresponding to the position of the second opening of the main back cover and exposing the second sub-cover through the second opening. In the present embodiment, the main back cover only includes the first opening and the second opening for accommodating the first sub-cover and the second sub-cover, but is not limited thereto. In different embodiments, the manufacture method of the present invention can include steps of forming a third opening or other number of openings based on the circuitry and space requirements and connecting additional sub-covers to the main back cover corresponding to the additional openings.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:
1. A flat display device, comprising:
a flat display module;
an auxiliary support connected to a back side of the flat display module;
a back cover set for coupling to the flat display module, wherein the back cover set includes:

at least one sub-cover; and a main back cover having at least one opening, wherein the sub-cover is disposed corresponding to the opening and exposed through the opening; and at least one circuit board disposed on the sub-cover, wherein the circuit board is located between the sub-cover and the auxiliary support.

2. The flat display device of claim 1, wherein the flat display module includes a display panel and a frame, the frame is disposed surrounding the display panel and coupled to the auxiliary support.

3. The flat display device of claim 2, further comprising:
a stand coupler coupled to the auxiliary support; and
a supporting stand, one end of the supporting stand being coupled to the stand coupler while the other end of the supporting stand extending outside an overlapping area between the back cover set and the flat display module.

4. The flat display device of claim 1, wherein the auxiliary support includes:
at least two first ribs parallel to each other and coupled to the flat display module; and
at least one second rib, one end of the second rib being connected to one of the first ribs, the other end of the second rib being connected to another first rib, wherein the second rib is substantially perpendicular to the first ribs.

5. The flat display device of claim 4, wherein the circuit board is disposed between the first ribs of the auxiliary support and the sub-cover or between the second rib and the sub-cover.

6. The flat display device of claim 1, wherein the sub-cover includes:
a back cover portion, one side of the back cover portion being disposed with the circuit board and the other side of the back cover portion exposed through the opening; and
a plurality of connecting portions, disposed perpendicularly on an edge of the back cover portion, for coupling with the flat display module;
wherein the connecting portions substantially perpendicularly extend from the back cover portion and is partially bent to form a space between the connecting portions and the back cover portion.

7. The flat display device of claim 6, further comprising at least one first electronic module disposed on the circuit board, wherein the circuit board is disposed within the space and above an inner surface of the sub-cover.

8. The flat display device of claim 1, wherein the flat display module is a liquid crystal display module.

9. A manufacture method for flat display device, comprising:
coupling an auxiliary support to a back side of a flat display module;
disposing a circuit board on an inner surface of a sub-cover;
coupling the sub-cover to the auxiliary support, wherein the circuit board is located between the sub-cover and the auxiliary support; and
coupling a main back cover to the sub-cover or the auxiliary support from the back side of the flat display module, wherein the sub-cover is disposed corresponding to an opening of the main back cover and exposed through the opening.

10. The manufacture method of claim 9, wherein the step of coupling the auxiliary support comprises:
coupling at least two first ribs of the auxiliary support to the back side of the flat display module in parallel; and
coupling at least one second rib of the auxiliary support to the first ribs of the auxiliary support, wherein the second rib is substantially perpendicular to the first ribs.

11. The manufacture method of claim 9, further comprising:
disposing a frame surrounding a display panel of the flat display module; and
coupling the auxiliary support to the frame.

12. The manufacture method of claim 11, further comprising:
coupling a stand coupler to the auxiliary support; and
coupling a supporting stand to the stand coupler, wherein part of the supporting stand extends outside an overlapping area between the main back cover and the flat display module.

13. The manufacture method of claim 9, further comprising disposing a plurality of connecting portions on an edge of a back cover portion of the sub-cover to form a space between the connecting portions and the back cover portion, wherein a dimension of the back cover portion corresponds to a dimension of the opening.

14. The manufacture method of claim 13, further comprising disposing an electronic module on the circuit board, wherein the circuit board is disposed within the space and above an inner surface of the sub-cover.

15. The flat display device of claim 4, wherein the second rib is stacked on the flat display module.

* * * * *